(12) United States Patent
Fenigstein et al.

(10) Patent No.: US 9,865,640 B2
(45) Date of Patent: Jan. 9, 2018

(54) BACKSIDE ILLUMINATED (BSI) CMOS IMAGE SENSOR (CIS) WITH A RESONANT CAVITY AND A METHOD FOR MANUFACTURING THE BSI CIS

(71) Applicant: Tower Semiconductor Ltd., Migdal Haemek (IL)

(72) Inventors: Amos Fenigstein, Haifa (IL); Assaf Lahav, Binyamina (IL)

(73) Assignee: TOWER SEMICONDUCTOR LTD., Migdal Haemeq (IL)

( * ) Notice: Subject to any disclaimer, the term of this patent is extended or adjusted under 35 U.S.C. 154(b) by 0 days.

(21) Appl. No.: 15/011,573

(22) Filed: Jan. 31, 2016

(65) Prior Publication Data
US 2017/0221941 A1 Aug. 3, 2017

(51) Int. Cl.
*H01L 21/00* (2006.01)
*H01L 27/146* (2006.01)

(52) U.S. Cl.
CPC .... *H01L 27/1464* (2013.01); *H01L 27/14625* (2013.01); *H01L 27/14629* (2013.01); *H01L 27/14685* (2013.01)

(58) Field of Classification Search
CPC ........... H01L 27/1464; H01L 27/14625; H01L 27/14685
See application file for complete search history.

(56) References Cited

U.S. PATENT DOCUMENTS

| | | | | |
|---|---|---|---|---|
| 6,770,882 | B2 * | 8/2004 | Carr | G01J 3/26 250/332 |
| 7,521,658 | B2 * | 4/2009 | Matthews | H01L 27/14667 250/208.1 |
| 7,541,584 | B2 * | 6/2009 | Antoszewski | G01J 3/02 250/338.1 |
| 8,174,698 | B2 * | 5/2012 | Peter | G01N 21/05 356/432 |
| 8,427,652 | B2 * | 4/2013 | Bendix | G01B 9/02023 356/496 |
| 8,436,423 | B2 * | 5/2013 | Asher | H01L 27/14621 257/341 |
| 2004/0100678 | A1 * | 5/2004 | Chang | G02B 26/001 359/290 |
| 2004/0217264 | A1 * | 11/2004 | Wood | G01B 11/272 250/214 R |
| 2005/0017177 | A1 * | 1/2005 | Tai | G01J 3/26 250/338.4 |
| 2006/0077509 | A1 * | 4/2006 | Tung | G02B 26/001 359/260 |
| 2006/0118721 | A1 * | 6/2006 | Antoszewski | G01J 3/02 250/338.4 |
| 2006/0180886 | A1 * | 8/2006 | Tsang | G02B 5/282 257/432 |
| 2008/0193076 | A1 * | 8/2008 | Witzens | G02B 6/12007 385/14 |
| 2009/0159785 | A1 * | 6/2009 | Tsang | G02B 5/288 250/226 |

(Continued)

*Primary Examiner* — Laura Menz
(74) *Attorney, Agent, or Firm* — Reches Patents

(57) ABSTRACT

A backside illuminated semiconductor image sensor that includes a Fabry-Perot resonator tuned to absorb near infrared (NIR) radiation; wherein the Fabry-Perot resonator comprises a front reflector, a back reflector and an active Silicon layer between the front reflector and the back reflector.

15 Claims, 5 Drawing Sheets

(56) References Cited

U.S. PATENT DOCUMENTS

| | | | |
|---|---|---|---|
| 2011/0175185 A1* | 7/2011 | Asher | H01L 27/14621 257/432 |
| 2011/0299166 A1* | 12/2011 | Sun | B32B 37/02 359/579 |
| 2012/0200852 A1* | 8/2012 | Tejada | G01J 3/12 356/326 |
| 2012/0219023 A1* | 8/2012 | Cahill | H01S 5/141 372/20 |
| 2012/0273652 A1* | 11/2012 | Lenchenkov | H01L 27/1462 250/208.1 |
| 2013/0154041 A1* | 6/2013 | Kokubun | H01L 27/146 257/432 |
| 2013/0163005 A1* | 6/2013 | Tsang | G01J 3/513 356/519 |
| 2013/0293749 A1* | 11/2013 | Vaartstra | H04N 9/045 348/273 |
| 2014/0226046 A1* | 8/2014 | Lahav | H04N 5/353 348/296 |
| 2015/0207291 A1* | 7/2015 | Rickman | H01S 5/142 372/20 |
| 2015/0276947 A1* | 10/2015 | Hoenk | G01T 1/249 250/363.03 |
| 2016/0123809 A1* | 5/2016 | Learmonth | G01J 3/26 356/454 |
| 2016/0352072 A1* | 12/2016 | Belkin | H01S 5/1021 |
| 2017/0221941 A1* | 8/2017 | Fenigstein | H01L 27/1461 |

* cited by examiner

BACKSIDE ILLUMINATED (BSI) CMOS IMAGE SENSOR (CIS) WITH A RESONANT CAVITY AND A METHOD FOR MANUFACTURING THE BSI CIS

BACKGROUND OF THE INVENTION

Complementary metal oxide semiconductor (CMOS) image sensors (CIS) are manufactured using CMOS technology. In backside illuminated (BSI) CISs radiation sensed by the BSI CIS does not propagate through metal and dielectric layers.

FIG. 1 includes various cross sections that illustrate the manufacturing process of a prior art BSI CIS.

The manufacturing process may include:
a. Manufacturing a sensor wafer 20 that may be an epitaxial (epi) sensor wafer. The sensor wafer 20 may include a bulk (Bulk Si) 21, an active Silicon (Si) layer 22 which is an epitaxial grown Si, dielectric and metal layers ("back end") 23 and first oxide adhesion layer 24.
b. Manufacturing a carrier wafer 30 which includes Si bulk 31 and a second oxide adhesion layer 32.
c. Bonding the sensor wafer 20 to the carrier wafer 30 to form wafer 40 by attaching the first and second oxide adhesion layers 24 and 32 to each other.
d. Removing the Si bulk 21 to expose active Si layer 22.
e. On top of the active Si layer 22 adding layers such as micro lenses 41, color filters (CFA) 42 and anti-reflective coating (ARC) layer 43 by a process that may include passivation, deposition of anti-reflecting coating, fabricating color filters, fabricating micro-lenses, and pad opening.

ARC layer 43 prevents the reflection of light that propagates towards the active Si layer.

In several applications, and especially for three dimensional imaging, there is a need for high resolution sensors (and thus small pixels sensor) which have good quantum efficiency (QE) in the Near Infrared (NIR) and good modulation transfer function (MTF)—providing no crosstalk between pixels.

These requirements usually contradict each other since in NIR, the Si absorption coefficient is small, and a quite thick (much more than 10 microns) active Si layer is needed.

Pixels with dimensions that are significantly smaller than the active Si layer thickness are prone to severe crosstalk due to lateral diffusion of the generated carriers.

Furthermore, a typical request for such sensors is to be sensitive in a very narrow and specific wavelength, namely the light emitting diode (LED) and/or laser wavelength which this sensor is planned to detect. Other wavelengths are considered "background" illumination which has no contribution and in contrary add noise.

An external narrow band optical filter is usually used to avoid it.

Two known solution to the MTF/QE strong tradeoff are using high resistivity epitaxial material (epi) and using black Silicon.

Using high resistivity material includes forming the sensor on a thick epi, but with very low doping level (high resistivity epi). This makes depletion regions much larger and the fields formed by the photodiode penetrate deep into the epi layer. The carriers are swept towards the surface by the field rather than by diffusion. This reduces significantly the cross-talk.

Black Silicon is formed by processing the surface of the Si in order to change the direction of the incident photons. The black Silicon becomes a good NIR absorber even for shallow Si layer. Nevertheless, the issue of cross-talk remains and must be treated separately.

There is a growing need to provide a BSI CIS that exhibit high resolution, good quantum efficiency in NIR and good MTF—providing no crosstalk between pixels.

SUMMARY

According to an embodiment of the invention there may be provided a backside illuminated semiconductor image sensor may include a Fabry-Perot resonator tuned to absorb near infrared radiation; and wherein the Fabry-Perot resonator may include a front reflector a back reflector and an active Silicon layer between the front reflector and the back reflector.

The backside illuminated semiconductor image sensor may include metal and dielectric layers that are positioned between the active Silicon layer and the back reflector.

The back reflector can be made of metal.

The back reflector may include multiple dielectric layers.

The thickness of the Fabry-Perot resonator may range between one and ten microns.

The Fabry-Perot resonator may have multiple spaced apart resonance wavelengths within a range that spans from 700 nanometers and 1000 nanometers.

The front reflector and the back reflector may be fabricated from backend Silicon Oxide and Silicon Nitride dielectrics.

According to an embodiment of the invention there may be provided a method for fabricating a backside illuminated semiconductor image sensor the method may include receiving or fabricating a bulk an active Silicon layer and back reflector; wherein the active Silicon layer is positioned between the bulk and the back reflector; removing the bulk; and fabricating a front reflector on the active Silicon layer to provide a Fabry-Perot resonator tuned to absorb near infrared radiation.

The removing of the bulk may be preceded by attaching the back reflector to a support element.

The attaching may include attaching the back reflector to the support element by one or more adhesive layers.

The bulk, the active Silicon layer and the back reflector may belong to an epitaxial wafer and wherein the support element belongs to a carrier wafer.

The epitaxial wafer may be Silicon on insulator wafer.

The removing of the bulk may include etching the bulk while using a BOX layer of the Silicon on insulator wafer as a etch stop.

The back reflector can be made of metal.

The back reflector may include multiple dielectric layers.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
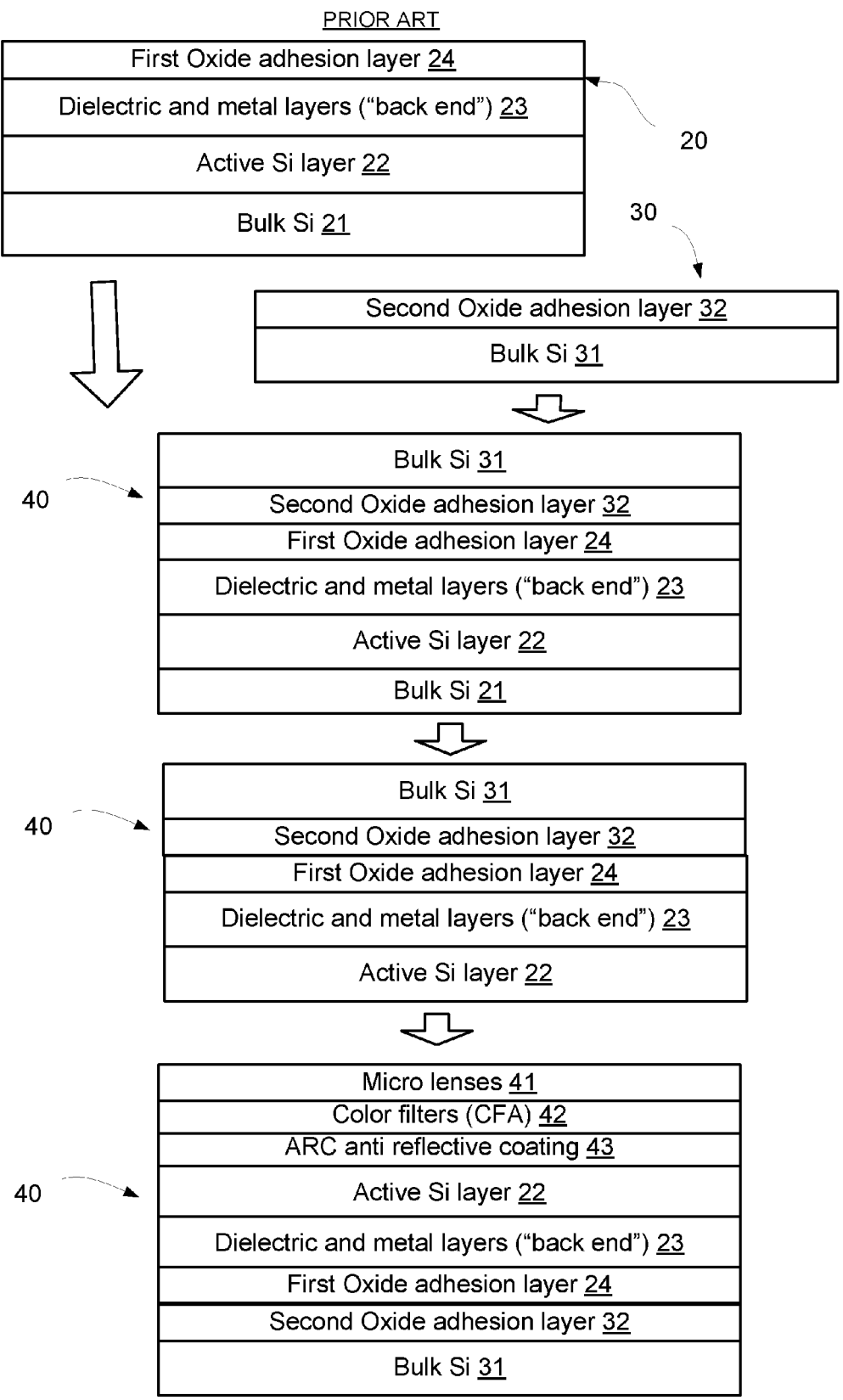
FIG. 1 includes various cross sections that illustrate the manufacturing process of a prior art BSI CIS.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

According to an embodiment of the invention there is provided a backside illumination image sensor.

The term sensor wafer means a wafer that includes one or more sensors such BSI CISs.

The term carrier wafer means a wafer that is aimed to provide structural support to another wafer. The other wafer may be a sensor wafer.

The suggested backside illumination image sensor enables the usage of much thinner active Si layer (for example—4 microns, 3.0 microns, 2 microns and the like) which has minimal crosstalk (and thus good MTF), and still have high quantum efficiency—that may approach, for example, 100%.

Figure 2:
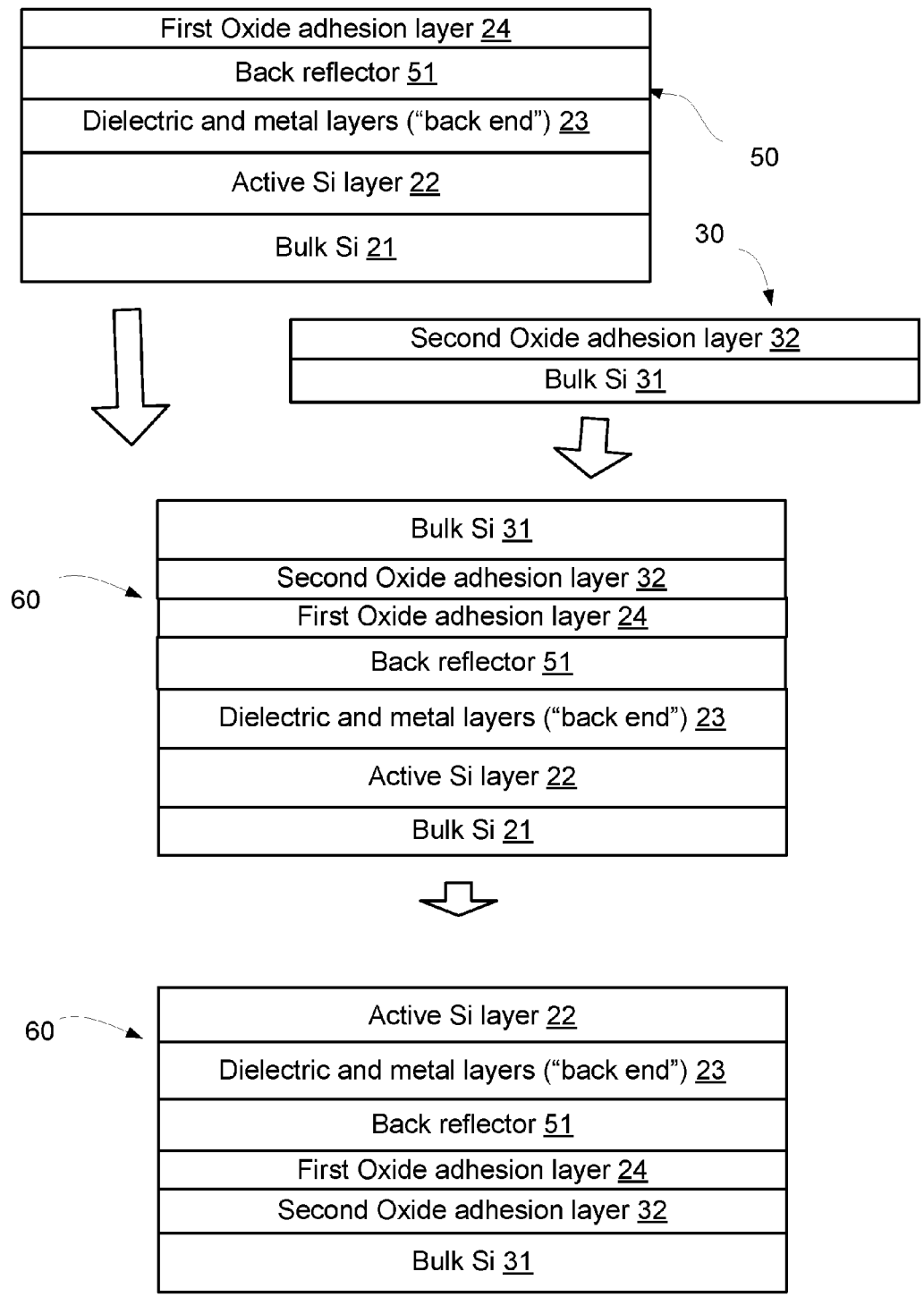
FIG. 2 includes various cross sections that illustrate the manufacturing process of a BSI CSI according to an embodiment of the invention.
Figure 3:
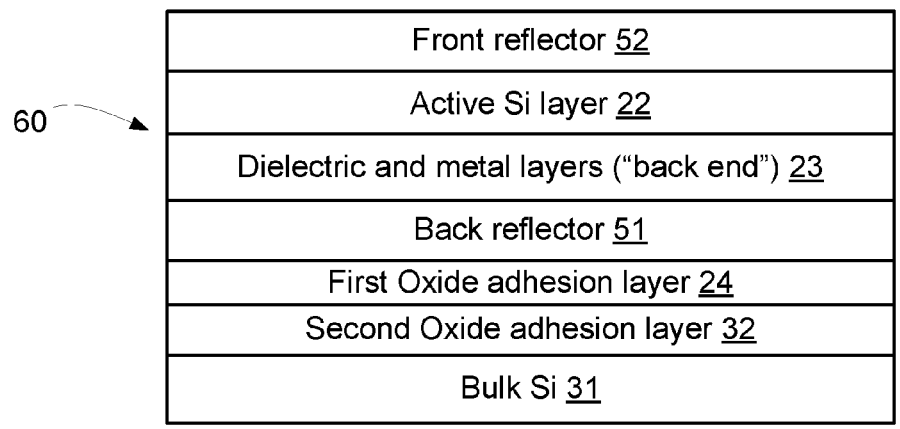
FIG. 3 includes cross section of two BSI CISs according to various embodiments of the invention.
Figure 3:
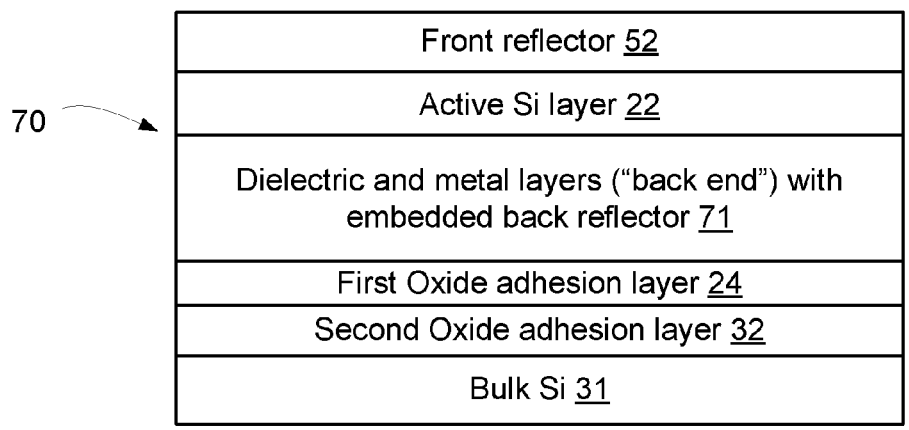

FIGS. 2 and 3 include various cross sections that illustrate the manufacturing process of various BSI CSIs according to an embodiment of the invention.

The manufacturing process of BSI CIS 60 may include:

a. Manufacturing a sensor wafer 50 that includes a bulk (Bulk Si) 21, an active Silicon (Si) layer 22 which is an epitaxial grown Si, dielectric and metal layers ("back end") 23, back reflector 51 and first oxide adhesion layer 24. Sensor wafer 50 may be an epitaxial wafer.

b. Manufacturing a carrier wafer 30 which includes Si bulk 31 and a second oxide adhesion layer 32.

c. Bonding the sensor wafer 50 to the carrier wafer 20 to form wafer 60 by attaching the first and second oxide adhesion layers 24 and 32 to each other.

d. Removing the Si bulk 21 to expose active Si layer 22.

e. On top of the active Si layer 22 forming front reflector 52

Front reflector 52, active Si layer 22 and back reflector 51 provide a Fabry-Perot resonator that is tuned to NIR.

The Fabry-Perot resonator is tuned to NIR in the sense that the first and back reflectors are spaced apart from each other to facilitate multiple spaced apart specific resonance wavelength usually in the NIR within the Si absorbance range (up to 1000 nm)

When radiation having a resonance wavelength impinges onto the Fabry-Perot resonator the radiation repetitively propagates between the first and back reflectors and each time a part of the radiation is absorbed by the active Si layer—contributing to the detection of the radiation- and increasing the QE.

The following equations allow the comparison between the possible QE (quantum efficiency) for a certain Si thin layer with an ARC and a Fabry-Perot resonator with enhanced QE.

In case of no cavity (see also curve 210 of FIG. 5):

$$QE=(1-R)\cdot[1-\exp(-\alpha d)]$$

$$a \equiv \exp(-\alpha d)$$

If a good ARC is used we can assume R is close to zero. So, in this case $$QE \approx 1-a$$

In the presence of a cavity with two reflectors with reflectivities R1 (front surface) and R2 (back surface) the reflectance is $$QE = \frac{(1-R_1)(1+R_2a)(1-a)}{1-2\sqrt{R_1R_2}\cdot a\cdot\cos(2\beta L)+R_1R_2a^2}$$

$$\beta \equiv \frac{2\pi n}{\lambda},$$

Where L is the cavity depth, n is the refractive index and λ is the wavelength. In the peak, the cosine function equals 1, so the peak QE (where cos(βL)=1) will be:

$$QE = \frac{(1-R_1)(1+R_2a)(1-a)}{1-2\sqrt{R_1R_2}\cdot a+R_1R_2a^2} = \frac{(1-R_1)(1+R_2a)(1-a)}{\left(1-\sqrt{R_1R_2}\cdot a\right)^2}$$

QE may be much larger than a. For small pixel we can assume active Si layer thickness of about 2.5 micron, front reflector reflectivity of 0.95 and back reflector reflectivity of 0.8.

For 2.5 micron, active Si layer absorption (1−a) is about 10%. Putting these values into the above equation, we get QE of 80%, compared with 10% with a perfect ARC and no resonant cavity.

All the above is just a very specific example which might by typical but brought only for demonstration of the idea FIG. 3 also illustrates BSI CIS 70 according to another embodiment of the invention.

BSI CIS 70 of FIG. 3 differs from BSI CIS 60 by having (instead of a dielectric and metal layers 23 that and a separate back reflector 51) dielectric and metal layers with embedded back reflector 71.

The back reflector 51 can be made of metal (may be fabricated by a dedicated mask).

It is noted that within the dielectric/metal can be additional metal between the metal layer or above the last metal layer. When the back reflector is made of metal it should be positioned such as not to cause unwanted shorts between other conductors such as contacts and vias.

Alternatively, the back reflector 51 may include multiple dielectric layers. These dielectric layers are either special dielectric layer introduced to form a reflector within the dielectric metallization layer ("backend") of by tuning the thicknesses of the underlying VLSI process. For instance, in fabrication processes that use Copper as conductors there may be dielectric layers which alternate layers of Si oxide (SiO2) and Si Nitride (SiN). These alternating dielectric layers can be tuned to provide an optical reflector.

Figure 5:
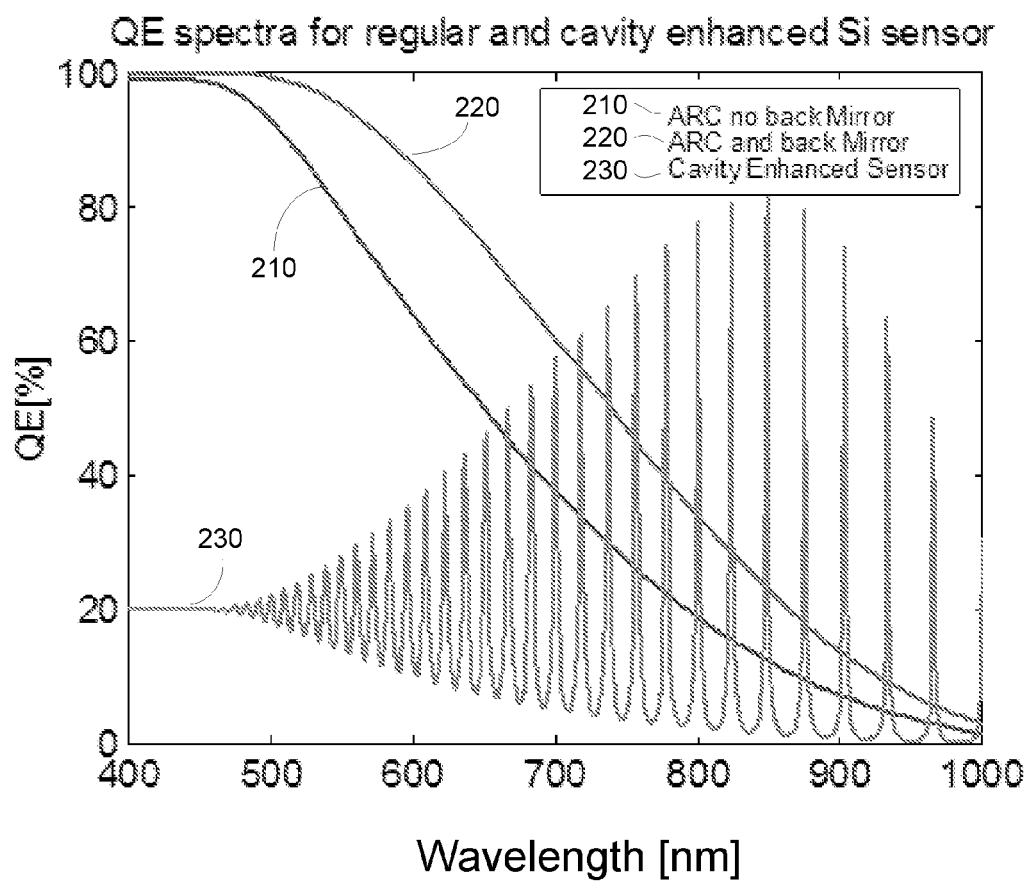
FIG. 5 illustrates a comparison between quantum efficiency at different wavelengths of prior art BSI CIS and of a BSI CIS according to an embodiment of the invention.

FIG. 5 includes curve 210 that represents the QE at different wavelengths of a prior art sensor with 2.5 micron active Si layer absorption layer and a perfect ARC on the front side (no back reflector).

FIG. 5 also includes curve 220 that represents the QE at different wavelengths for a prior art sensor having a perfect ARC at the front side and 95% reflecting mirror at the back side.

FIG. 5 also includes curve 230 that represents the QE at different wavelengths for a BSI CIS pixel that includes a Fabry-Perot resonator with a front reflector of 80% reflectance and a back reflector of 95% reflectance.

Figure 4:
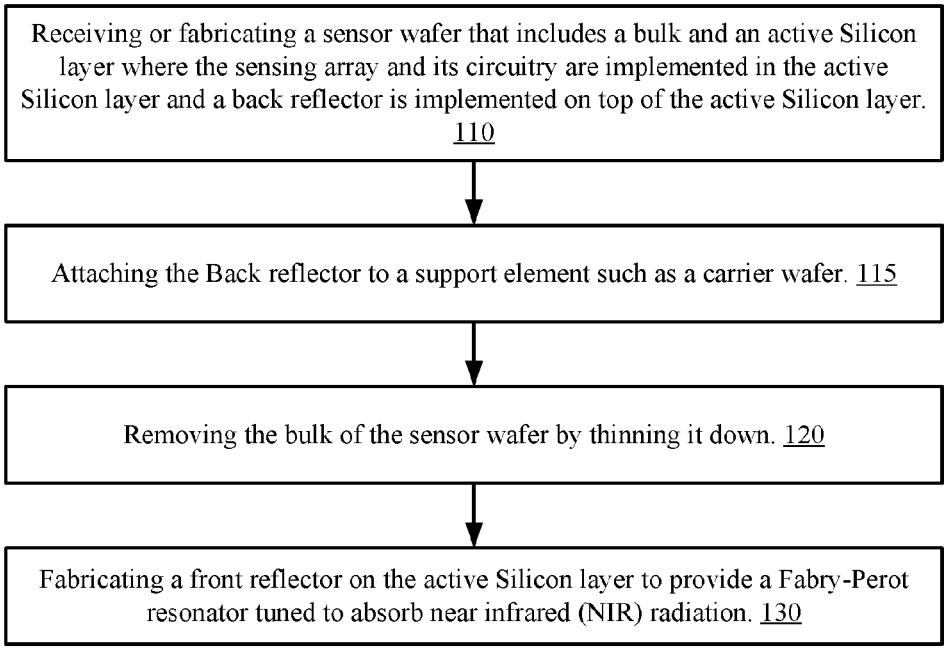
FIG. 4 illustrates a method according to an embodiment of the invention.

FIG. 4 illustrates method 100 according to an embodiment of the invention.

Method 100 may start by step 110 of receiving or fabricating a sensor wafer that includes a bulk and an active Silicon layer where the sensing array and its circuitry are implemented in the active Silicon layer and a back reflector is implemented on top of the active Silicon layer.

The back reflector may be emdebbed in dielectric and metal layers of the sensor wafer. Alternatively—the back reflector may not be included in the dielectric and metal layers of the sensor wafer.

The sensor wafer may be an epitaxial wafer.

The epitaxial wafer may be Silicon on insulator (SOI) wafer.

Step 110 may be followed by step 115 of attaching the back reflector to a support element. The support element may be a carrier wafer.

Step 115 may include attaching the back reflector to the support element by one or more adhesive layers.

Step 115 may be followed by step 120 of removing the bulk.

Step 120 may include etching the bulk while using a BOX layer of the SOI wafer as a etch stop.

Step 120 may be followed by step 130 of fabricating a front reflector on the active Silicon layer to provide a Fabry-Perot resonator tuned to absorb near infrared (NIR) radiation.

The Fabry-Perot resonator includes the front reflector, the back reflector and at least the active Silicon layer.

Each one of the front reflector and the back reflector can be made of metal.

Alternatively, each one of the front reflector and the back reflector can be includes multiple dielectric layers.

Any reference to any of the terms "comprise", "comprises", "comprising" "including", "may include" and "includes" may be applied to any of the terms "consists", "consisting", "consisting essentially of".

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A backside illuminated semiconductor image sensor that consists essentially of a bulk and a Fabry-Perot resonator, wherein the Fabey-Perot resonator is configured to sense light that passes through the bulk before reaching the Fabey-Perot resonator, wherein the Fabry-Perot resonator is tuned to absorb near infrared radiation; and wherein the Fabry-Perot resonator comprises a front reflector, a back reflector and an active Silicon layer between the front reflector and the back reflector.

2. The backside illuminated semiconductor image sensor according to claim 1, wherein the Fabry-Perot resonator comprises metal and dielectric layers that are positioned between the active Silicon layer and the back reflector.

3. The backside illuminated semiconductor image sensor according to claim 1, further comprising a bulk that differs from the back reflector and wherein the back reflector is made of metal.

4. The backside illuminated semiconductor image sensor according to claim 1, wherein the back reflector comprises multiple dielectric layers.

5. The backside illuminated semiconductor image sensor according to claim 1, wherein a thickness of the Fabry-Perot resonator ranges between one and ten microns.

6. The backside illuminated semiconductor image sensor according to claim 1, wherein the Fabry-Perot resonator has multiple spaced apart resonance wavelengths within a range that spans from 700 nanometers and 1000 nanometers.

7. The backside illuminated semiconductor image sensor according to claim 1, wherein the front reflector and the back reflector are fabricated from backend Silicon Oxide and Silicon Nitride dielectrics.

8. The backside illuminated semiconductor image sensor according to claim 1 wherein a reflectivity of the front reflector is 0.95 and a reflectivity of the back reflector is 0.8.

9. The backside illuminated semiconductor image sensor according to claim 1 wherein the backside illuminated semiconductor image sensor consists of the Fabry-Perot resonator and the bulk.

10. The backside illuminated semiconductor image sensor according to claim 1 wherein the Fabry-Perot resonator consists essentially of the front reflector, the back reflector, the active Silicon layer between the front reflector and the back reflector, and metal and dielectric layers that are positioned between the active Silicon layer and the back reflector.

11. The backside illuminated semiconductor image sensor according to claim 10, wherein the back reflector is made of metal.

12. The backside illuminated semiconductor image sensor according to claim 10, wherein the back reflector consists essentially of multiple dielectric layers.

13. The backside illuminated semiconductor image sensor according to claim 10, wherein a thickness of the Fabry-Perot resonator ranges between one and ten microns.

14. The backside illuminated semiconductor image sensor according to claim 10, wherein the front reflector and the back reflector are fabricated from backend Silicon Oxide and Silicon Nitride dielectrics.

15. The backside illuminated semiconductor image sensor according to claim 1 wherein the back reflector is embedded in dielectric and metal layers of the Fabey-Perot resonator.

* * * * *